United States Patent [19]
Shu et al.

[11] Patent Number: 5,457,407
[45] Date of Patent: Oct. 10, 1995

[54] BINARY WEIGHTED REFERENCE CIRCUIT FOR A VARIABLE IMPEDANCE OUTPUT BUFFER

[75] Inventors: Lee-Lean Shu, Los Altos; Kurt Knorpp, San Carlos, both of Calif.

[73] Assignee: Sony Electronics Inc., Park Ridge, N.J.

[21] Appl. No.: 268,118

[22] Filed: Jul. 6, 1994

[51] Int. Cl.$^6$ .............................................. H03R 19/0185
[52] U.S. Cl. ................................. 326/30; 326/83; 326/87
[58] Field of Search ................................ 326/27, 30, 83, 326/85, 87

[56] References Cited

U.S. PATENT DOCUMENTS

| | | | |
|---|---|---|---|
| 4,719,369 | 1/1988 | Asano et al. | 326/30 |
| 5,107,230 | 4/1992 | King | 326/30 X |
| 5,134,311 | 7/1992 | Biber et al. | 326/30 X |
| 5,162,672 | 11/1992 | McMahan et al. | 326/30 X |
| 5,371,420 | 12/1994 | Nakao | 326/27 |

Primary Examiner—David R. Hudspeth
Attorney, Agent, or Firm—Ronald P. Kananen

[57] ABSTRACT

An output buffer comprises a reference circuit having a plurality of reference transistors connected in parallel to each other and a output driver circuit having a corresponding plurality of driver transistors connected in parallel with each other. The reference transistors and the driver transistors both have varying widths with the widths of the reference transistors being a binary fraction, for instance one fourth, smaller than the widths of the corresponding output driver transistors. The transistors in the reference circuit are selectively conducted in order to match an impedance of the reference transistors to the impedance of a user selected resistor, representing a fraction of the impedance of a transmission line. The selection of the reference transistors also determines the selection of the driver transistors and consequently causes the impedance of the output driver to match the impedance of the transmission line. The reduction of the reference circuit by the binary fraction reduces the size of the overall circuit, lowers power consumption, and allows a matched layout between the transistors of the output driver and the reference circuit.

8 Claims, 3 Drawing Sheets

BINARY WEIGHTED REFERENCE CIRCUIT FOR A VARIABLE IMPEDANCE OUTPUT BUFFER

BACKGROUND OF THE INVENTION

1. Field of the Invention

This invention relates to a reference circuit for a variable impedance output buffer and, more particularly, to a binary weighted reference circuit producing a variable impedance output buffer.

2. Description of Prior Art

To maximize the transfer of electrical power, a driver connected to a transmission line needs to have its output impedance matched to the impedance of the transmission line. To accomplish this matching, variable impedance output buffers have been used to vary the impedance of an output buffer to the impedance of the transmission line.

A prior art variable impedance resistor is shown in FIG. 1. The resistance across terminals A and B is a digitally controlled CMOS resistor having a plurality of transistors MP0, MP1, MP2, . . . MPN. The transistors MP0, MP1, MP2, . . . MPN are binary weighted transistors with the first transistor MP0 having a width of $2^0$ times a reference width $w_{ref}$, the second transistor MP1 having a width $2^1$ times the reference width $w_{ref}$, the third transistor MP2 having a width $2^2$ times the reference width $w_{ref}$, etc. The different widths in transistors MP0, MP1, MP2, . . . MPN produce different resistances across the drain and sources of the transistors. Thus, the resistance across terminals A and B can be varied by varying the conductance of transistors MP0, MP1, MP2, . . . MPN.

An input signal inverted with inverter INV is supplied to one input of NAND gates N0, N1, N2, . . . NN. The other input to each NAND gate is connected to a respective line of a control bus. The outputs of the NAND gates N0, N1, N2, . . . NN are inverted and are respectively supplied to the gates of transistors MP0, MP1, MP2, . . . MPN. For instance, the first bit 0 of the control bus is connected to the first NAND gate N0, which has its output inverted and connected to the gate of the first transistor MP0.

The variable resistance shown in FIG. 1 may be used in a circuit shown in FIG. 2. In this circuit, the potential $V_{MID}$ between resistances R2 and R3 is passed through a low pass filter 2 and then supplied to one input of a comparator 6. The other input to the comparator 6 is supplied with a potential $V_{LHALF}$ after passing through a low pass filter 4. Based upon a comparison of $V_{MID}$ to $V_{LHALF}$, the comparator 6 produces an up/down signal U/D which is supplied to a D flip-flop 8. The D flip-flop 8 is clocked by a ring oscillator 10 and supplies its Q output to an up/down counter 12. The output from the up/down counter 12 is then supplied to a transistor array 14, such as the one depicted in FIG. 1. Thus, the circuit shown in FIG. 2 adjusts the impedance across terminals A and B until the potential $V_{HALF}$ matches the potential $V_{MID}$.

Because not all transmission lines have the same impedance, an external reference pin is added to an integrated circuit 14 of the output buffer. This reference pin is connected to a supply voltage $V_{DD}$ via a resistor $R_1$ having a resistance equal to the impedance of the transmission line. The other side of the resistor from the supply voltage $V_{DD}$ is connected to an on-chip reference circuit that has its impedance varied to match the impedance of the external resistor $R_1$.

Because the reference circuit is fabricated on the same chip as the output driver, there is a need in the prior art for smaller reference circuits and for matched circuit layouts.

SUMMARY OF THE INVENTION

A general object of the present invention is to provide a variable impedance output buffer that is smaller than previously available in the prior art.

An object of the present invention is to also provide a variable impedance output buffer that consumes less power than prior output buffers.

Another object of the invention is to provide a matched layout of reference transistors and corresponding output driver transistors.

A further object of the present invention is to provide a variable impedance output buffer which can adapt to varying transmission line impedances.

Additional objects, advantages and novel features of the invention will be set forth in the description which follows, and will become apparent to those skilled in the art upon reading this description or practicing the invention. The objects and advantages of the invention may be realized and attained by the appended claims.

To achieve the foregoing and other objects, in accordance with the present invention, as embodied and broadly described herein, a variable impedance output buffer comprises a reference circuit and a output driver circuit. The reference circuit is comprised of a plurality of reference transistors of varying widths connected in parallel to each other and the output driver circuit is comprised of a corresponding plurality of driver transistors of varying widths connected in parallel to each other across a transmission line. The widths of each reference transistor is designed to be a fraction of a width of a corresponding driver transistor.

The output buffer has a controller for selectively conducting the reference transistors so that an impedance across the reference circuit transistors is matched to an external resistor. The external resistor is selected to be equal to a fraction of an impedance of the transmission line. Logic circuitry in the output buffer conducts the driver transistors which correspond to the selected reference circuit transistors. By matching the impedance of the reference transistors to the impedance of the external resistor, an impedance of the output driver circuit is matched to the impedance of the transmission line.

According to a preferred aspect of the invention, the widths of the reference transistors are binary fractions of the widths of the corresponding output driver transistors and the binary fraction is preferably one fourth. Also, the layout of the reference transistors is matched with the layout of the output driver transistors. Furthermore, the widths of the driver transistors and of the reference transistors are selected to be binary multiples of each other.

The reduction of the reference circuit by the binary fraction in size lowers power consumption, saves area on the integrated chip, and allows a matched layout between the output driver and the reference circuit.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE PREFERRED EMBODIMENT

Figure 3:
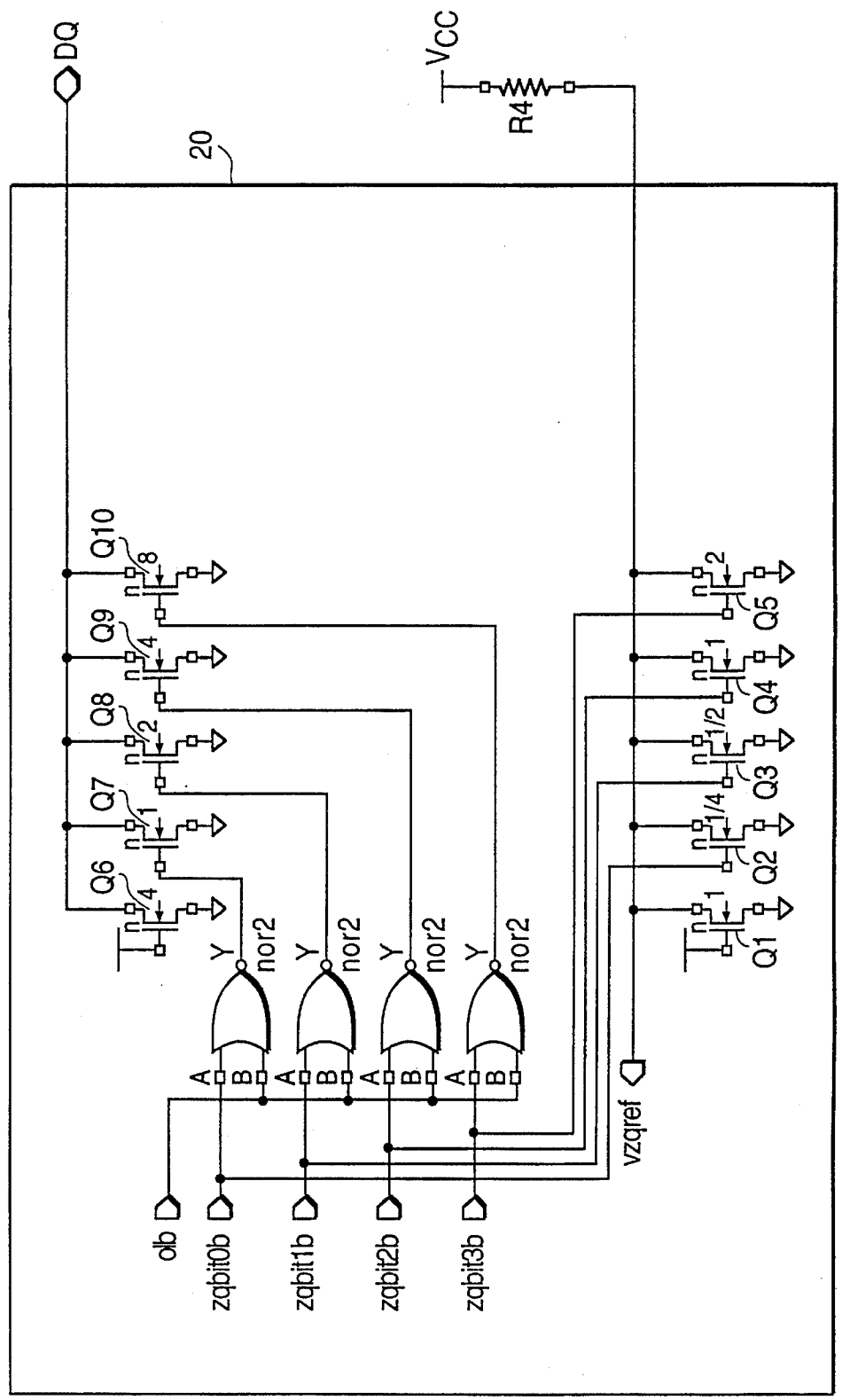
FIG. 3 is a schematic diagram of an embodiment of the present invention.

Reference will now be made in detail to the preferred embodiment of the invention, an example of which is illustrated in FIG. 3.

With reference to FIG. 3, an output buffer 20 comprises an array of NOR gates nor2, a reference circuit having an array of transistors Q1 to Q5, and an output driver pull-down circuit having an array of transistors Q6 to Q10. The array of NOR gates nor2 receives a data signal line olb at their B inputs and receives a respective bit from a control signal zq at each of the A inputs. For instance, the control signal may comprises four bits zqbit0b to zqbit3b which are supplied to four NOR gates nor2.

The output signals from the four NOR gates nor2 are respectively supplied to the gates of transistors Q7 to Q10 in the output driver pull-down circuit of the output buffer 20. The transistors Q7 to Q10 are arranged in parallel with each other with the drains tied to ground and the sources connected to the output transmission line. The gates of transistors Q7 to Q10 are respectively supplied with the outputs from the four NOR gates nor2. The transistor Q6 has its gate connected to a fixed potential.

The transistors Q1 to Q5 in the reference circuit are connected in parallel with each other with the drains tied to ground and the sources connected to one end of a resistor R4 at a node vzqref. The transistors Q2 to Q5 are respectively supplied with the signals from the four bit control signal zqbit0b to zqbit3b. The transistor Q1 has its gate connected to a fixed potential.

The transistors Q1 to Q5 in the reference circuit have widths which are a fraction smaller than the widths of corresponding transistors Q6 to Q10 in the output driver pull-down circuit. In the embodiment illustrated, the widths of the transistors Q1 to Q5 in the reference circuit are a binary fraction of the widths of the corresponding transistors Q6 to Q10 in the output driver pull-down section. The binary fraction used in FIG. 3 is ¼, thereby making the width of each reference transistor Q1 to Q5 one-fourth the width of the corresponding output driver transistor Q6 to Q10. Moreover, the widths of the transistors within the reference circuit, as well as the widths of the transistors in the driver circuit, are binary multiples of each other.

The resistor R4 is an external reference resistor selected to match the impedance of the transmission line and is actually chosen to be the same fraction of the transmission line as the transistors Q1 to Q5 are a fraction of the transistors Q6 to Q10. Therefore, for instance, for a 50 ohm transmission line, the resistor R4 is selected to have a resistance one fourth of 50 ohms, or 12.5 ohms. The resistor R4 has one end connected to a voltage source $V_{CC}$ and the other end connected to the node vzqref.

In operation, the four bits zqbit0b to zqbit3b of the control signal selectively turn on or off the transistors Q2 to Q5. Because each transistor Q2 to Q5 has a different width, each transistor Q2 to Q5 has a different drain to source impedance when the transistor is conducting. Therefore, by properly selecting which ones of the transistors Q2 to Q5 are turned on, the impedance across node vzqref to ground may be varied to any desired amount.

Figure 1:
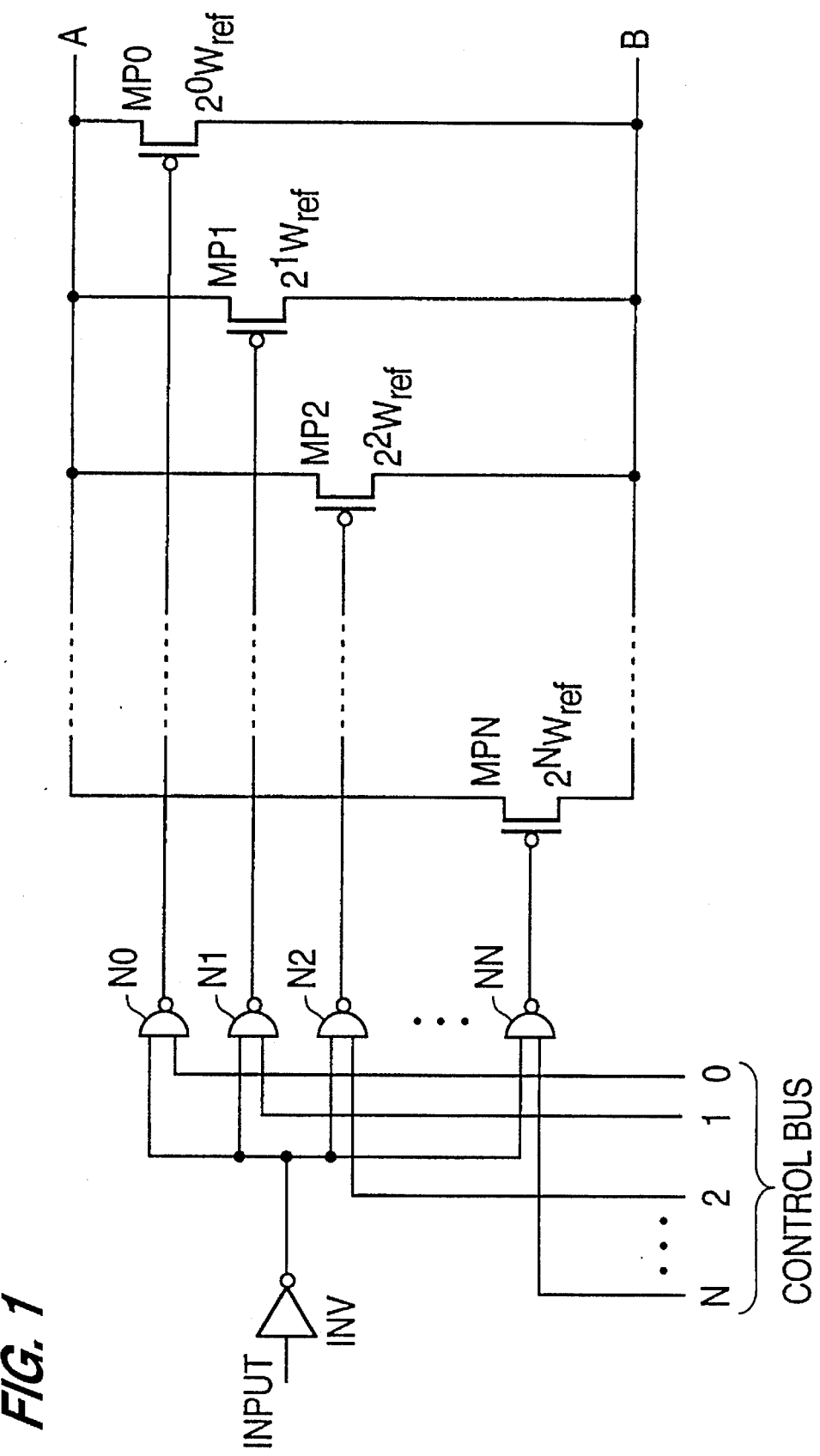
FIG. 1 is a prior art variable impedance transistor array.
Figure 2:
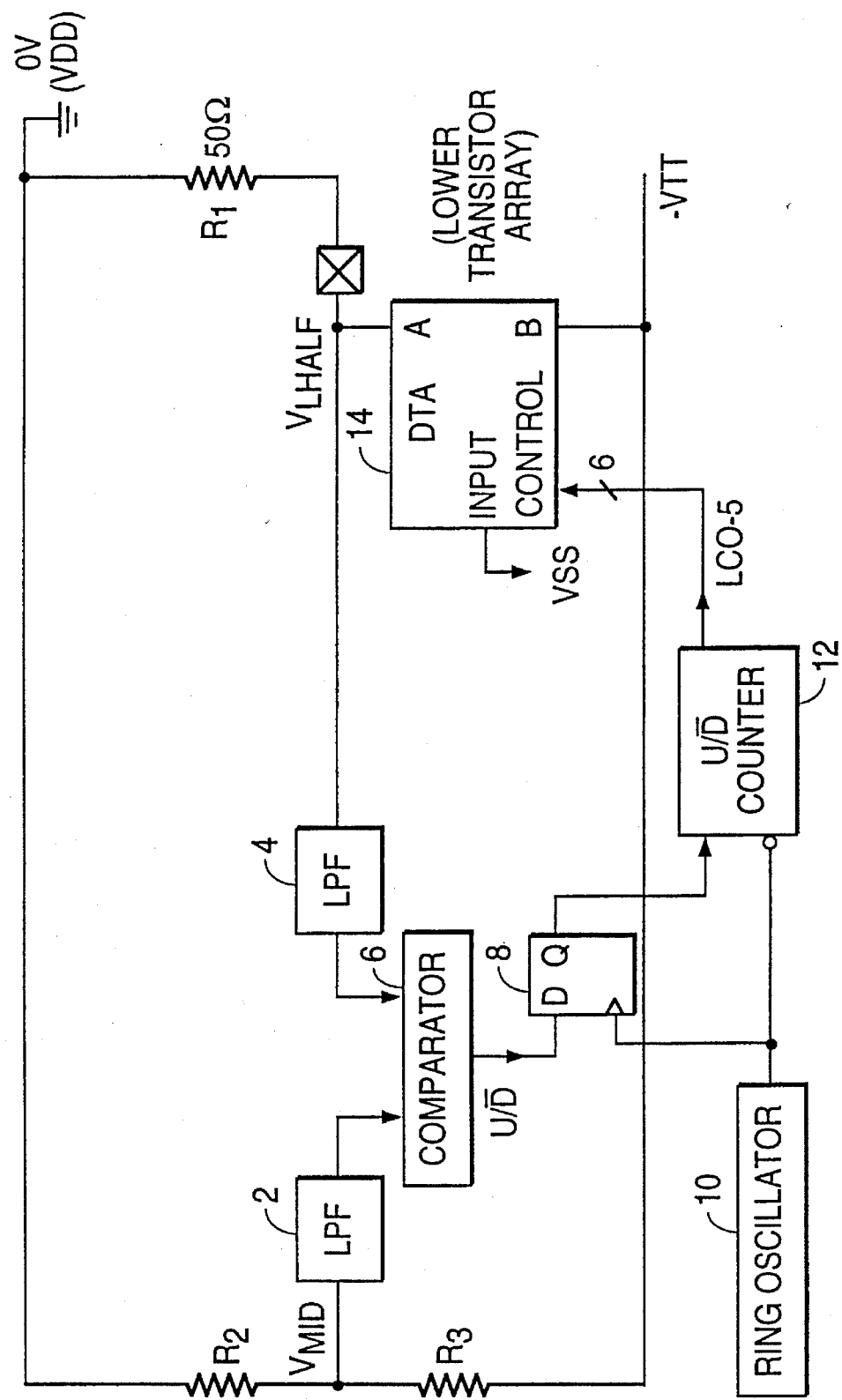
FIG. 2 is a prior art circuit utilizing the variable impedance transistor array of FIG. 1.

A preferred manner of varying this impedance is by sampling the voltage at node vzqref and by comparing this voltage to $V_{CC}/2$. Based upon the comparison, the four bits zqbit0b to zqbit3b of the control signal are varied and the transistors Q2 to Q5 are selectively turned on until the potential at node vzqref equals $V_{CC}/2$. Any known method of feeding back the potential at vzqref and of varying the control signal may be used, such as that shown in FIG. 2.

Besides controlling the conduction of the transistors Q1 to Q5, the four bits zqbit0b to zqbit3b of the control signal also select which ones of the output driver transistors Q6 to Q10 will be used to drive the transmission line. As discussed above, when the impedance of the reference circuit transistors Q1 to Q5 has been matched to the impedance of resistor R4, certain ones of the transistors Q1 to Q5 are conducting. The control bits zqbit0b to zqbit3b that turn on those certain transistors Q1 to Q5 also turn on corresponding transistors Q6 to Q10 in the output driver circuit. Thus, for instance, if transistors Q1, Q3, and Q5 are conducting in the reference circuit, transistors Q6, QS, and Q10 are conducting in the output driver circuit.

By having this correspondence in conducting transistors, the output driver impedance will be matched to the impedance of the transmission line. The transistors Q1 to Q5 in the reference circuit have been impedance matched to one fourth the impedance of the transmission line. Since the widths of the transistors Q6 to Q10 in the driver section are four times the widths of the transistors Q1 to Q5 in the reference circuit, the impedance of the transistors Q6 to Q10, which is the impedance of the output driver, will equal and be matched to the impedance of the transmission line. While the fraction one fourth has been used, it should be understood that other fractions other than a binary fraction may be employed.

In the preferred embodiment, the reference circuit also serves as a reference pad electrostatic discharge protection device. Also, the reference circuit and the output driver circuit preferably have the same impedance control. This common control enables the impedance of the reference circuit to be adjusted to match the impedance of a user selectable external resistor, which consequently enables the impedance of the output driver to be matched to the impedance of the transmission line.

According to a further aspect of the invention, the layout of the reference transistors matches the layout of the corresponding output driver transistor array. Specifically as shown in FIG. 3, the reference transistors Q1 to Q5 are fabricated as an integrated circuit at a location across from the corresponding output driver transistors Q6 to Q10. In this matched layout, the width of each reference transistor Q1 to Q5 is a binary multiple fraction, such as one fourth, of the width of the output driver transistor Q6 to Q10 disposed across the intergrated circuit.

According to a preferred embodiment, the output buffer 20, including the reference circuit transistors Q1 to Q5, the NOR gate array nor2, and the output driver pull-down transistors Q6 to Q10, is fabricated on a single integrated circuit chip, such as a static RAM (SRAM). The invention, however, could alternatively be applied to any integrated circuit. Also, in the preferred embodiment, the control signal comprises four bits of information, which is then supplied to the four NOR gates nor2 and to the gates of the four transistors Q2 to Q5. Instead, the output buffer 20 may instead use a larger or smaller number of control bits and associated NOR gates and reference circuit transistors.

With the invention, the output buffer uses a smaller reference circuit and produces a variable impedance output buffer which consumes less power, occupies less chip space, and allows a matched layout between the output driver and the reference circuit.

The foregoing description of a preferred embodiment of the invention has been presented for purposes of illustration and description only. It is not intended to be exhaustive or to limit the invention to the precise form disclosed. Many modifications and variations are possible in light of the above teaching. The embodiment was chosen and described in order to best explain the principles of the invention and its practical application to thereby enable others skilled in the art to best utilize the invention and various embodiments and with various modifications as are suited to the particular use contemplated. It is intended that the scope of the invention only be limited by the claims appended hereto.

What is claimed is:

1. A variable impedance output buffer, comprising:

a reference circuit comprising a plurality of reference transistors of varying widths connected in parallel to each other;

an output driver circuit comprising a plurality of driver transistors of varying widths connected in parallel to each other across a transmission line, said plurality of driver transistors correspond in number to said plurality of reference transistors with a width of each reference transistor being a fraction of a width of a corresponding driver transistor;

control means for generating a first control signal to selectively conduct said reference transistors so that an impedance across said reference circuit transistors is matched to an external resistor, said external resistor selected to be equal to said fraction of an impedance of said transmission line; and logic circuitry for receiving said control signal and for generating a second control signal to conduct the driver transistors that correspond to the selected reference circuit transistors;

wherein by matching said impedance of said reference transistors to said impedance of said external resistor, an impedance of said output driver circuit is matched to said impedance of said transmission line.

2. The variable impedance output buffer according to claim 1, wherein the width of each reference transistor is one-fourth the width of a corresponding output driver transistor.

3. The variable impedance output buffer according to claim 1, wherein the width of each reference transistor is a binary multiple of a width of an adjacent reference transistor.

4. The variable impedance output buffer according to claim 1, wherein the width of each driver transistor is a binary multiple of a width of an adjacent driver transistor.

5. The variable impedance output buffer according to claim 1, wherein the impedance of said external resistor is user selected to match the impedance of said transmission line.

6. The variable impedance output buffer according to claim 1, wherein said logic circuitry comprises a plurality of NOR gates each receiving a bit of said first control signal in a first input, a data signal in a second input, and generating said second control signal as outputs, said second control signal and said first control signal both having a plurality of bits.

7. The variable impedance output buffer according to claim 1, wherein said plurality of reference transistors are connected to one end of said external resistor and said control means samples a voltage at said one end of said external resistor in order to match said impedance of said reference transistors to said impedance of said external resistor.

8. The variable impedance output buffer according to claim 1, wherein said output buffer is fabricated on a single substrate with a layout of the reference transistors in the reference circuit matching a layout of the driver transistors in the output driver circuit.

* * * * *